(12) United States Patent
Wu et al.

(10) Patent No.: US 10,229,907 B1
(45) Date of Patent: Mar. 12, 2019

(54) SEMICONDUCTOR DEVICE AND METHOD FOR MANUFACTURING THE SAME

(71) Applicant: Vanguard International Semiconductor Corporation, Hsinchu (TW)

(72) Inventors: Cheng-Tsung Wu, Taipei (TW); Shin-Cheng Lin, Tainan (TW); Wen-Hsin Lin, Jhubei (TW); Yu-Hao Ho, Keelung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/699,572

(22) Filed: Sep. 8, 2017

(51) Int. Cl.
*H01L 27/088* (2006.01)
*H01L 21/265* (2006.01)
(Continued)

(52) U.S. Cl.
CPC .... *H01L 27/0883* (2013.01); *H01L 21/26513* (2013.01); *H01L 21/8236* (2013.01); *H01L 21/823418* (2013.01); *H01L 21/823475* (2013.01); *H01L 21/823481* (2013.01); *H01L 21/823493* (2013.01); *H01L 23/535* (2013.01); *H01L 29/0653* (2013.01); *H01L 29/0865* (2013.01); *H01L 29/0882* (2013.01); *H01L 29/1083* (2013.01); *H01L 29/1095* (2013.01); *H01L 29/66681* (2013.01); *H01L 29/7816* (2013.01)

(58) Field of Classification Search
CPC ............. H01L 27/0883; H01L 29/7816; H01L 21/823493; H01L 21/823475; H01L 21/823481; H01L 21/823418; H01L 29/66681; H01L 29/1083; H01L 23/535; H01L 29/0653; H01L 29/0882; H01L 29/0865; H01L 29/1095; H01L 21/26513; H01L 21/8236
See application file for complete search history.

(56) References Cited

U.S. PATENT DOCUMENTS 9,577,506 B1 * 2/2017 Chin ............... H02M 1/088
2013/0320445 A1 * 12/2013 Lee ................. H01L 29/7816
257/339

(Continued)

FOREIGN PATENT DOCUMENTS

TW 201709657 A 3/2017

*Primary Examiner* — Su C Kim
(74) *Attorney, Agent, or Firm* — Birch, Stewart, Kolasch & Birch, LLP (57) ABSTRACT

A semiconductor device includes a substrate, first and second body regions, a well region, a source region, a drain region, and first and second doped regions. The first and second body regions are disposed in first and second regions respectively. The well region is disposed in the first and second regions and between the first and second body regions. First and second portions of the source region are disposed in the first and second body regions respectively. The drain region is disposed on the well region. The first doped region is disposed in the well region. The second doped region is disposed on the first doped region. A first portion of the first doped region and a first portion of the second doped region are disposed in the well region of the first region and extend toward the first body region and out of the well region.

30 Claims, 11 Drawing Sheets

(51) Int. Cl.
*H01L 29/10* (2006.01)
*H01L 29/08* (2006.01)
*H01L 29/06* (2006.01)
*H01L 23/535* (2006.01)
*H01L 29/78* (2006.01)
*H01L 29/66* (2006.01)
*H01L 21/8234* (2006.01)
*H01L 21/8236* (2006.01)

(56) References Cited

U.S. PATENT DOCUMENTS

2014/0070315 A1* 3/2014 Levy ................... H01L 29/0634
   257/343
2015/0325694 A1* 11/2015 Chan ................... H03K 17/687
   327/434
2016/0351704 A1* 12/2016 Duan ................. H01L 29/7816

* cited by examiner

SEMICONDUCTOR DEVICE AND METHOD FOR MANUFACTURING THE SAME

BACKGROUND OF THE INVENTION

Field of the Invention

The invention relates to a semiconductor device, and more particularly to a method of manufacturing a power semiconductor device having a depletion structure and an enhancement structure.

Description of the Related Art

Generally, in a flyback power supplier, there is a depletion-type element used to convert an external alternating-current (AC) voltage to a direct-current (DC) voltage which serves as the supply voltage for the internal elements of the flyback power supplier. Moreover, there is also a power element having a small source-drain resistance in the flyback power supplier to transfer a voltage signal on the primary side to the circuit on the secondary side. The depletion-type element and the power element are generally implemented by two independence elements, which unfortunately increases the area of the circuitry. Moreover, after these elements are packaged, two lines are required to connect the depletion-type element to the drain of the power element, which increase the cost of the circuitry.

BRIEF SUMMARY OF THE INVENTION

An exemplary embodiment of a semiconductor device is provided. The semiconductor device comprises a substrate, a first body region, a second body region, a well region, a source region, a drain region, a first doped region, and a second doped region. The substrate has a first conductive type and comprises a first region and a second region. The first body region is disposed in the first region of the substrate. The second body region is disposed in the second region of the substrate. The second body region has the first conductive type. The well region is disposed in the first region and the second region of the substrate and between the first body region and the second body region. The well region has a second conductive type opposite to the first conductive type. The source region comprises a first portion disposed in the first body region and a second portion disposed in the second body region. The drain region is disposed on the well region. The first doped region is disposed in the well region. The first doped region has the first conductive type. The second doped region is disposed in the well region and stacked on the first doped region. The second doped region has the second conductive type. A first portion of the first doped region and a first portion of the second doped region are disposed in the well region of the first region of the substrate and extend toward the first body region and out of the well region.

An exemplary embodiment of a method for manufacturing a semiconductor device is provided. The method comprises steps of forming a substrate having a first conductive type, wherein the substrate comprises a first region and a second region; forming a first body region in the first region of the substrate; forming a second body region in the second region of the substrate, wherein the second body region has the first conductive type; forming a well region in the first region and the second region of the substrate, wherein the well region is formed between the first body region and the second body region and has a second conductive type opposite to the first conductive type; forming a source region, wherein a first portion of the source region is formed in the first body region, and a second portion of the source region is formed in the second body region; forming a drain region disposed on the well region; implanting a first dopant in the well region to form a first doped region, wherein the first doped region has the first conductive type; and implanting a second dopant in the well region and on the first doped region to form a second doped region, wherein the second doped region has the second conductive type. A first portion of the first doped region and a first portion of the second doped region are formed in the well region of the first region of the substrate and extend toward the first body region and out of the well region.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate not only that the layer directly contacts the other layer, but also that the layer does not directly contact the other layer, there being one or more intermediate layers disposed between the layer and the other layer.

Figure 1:
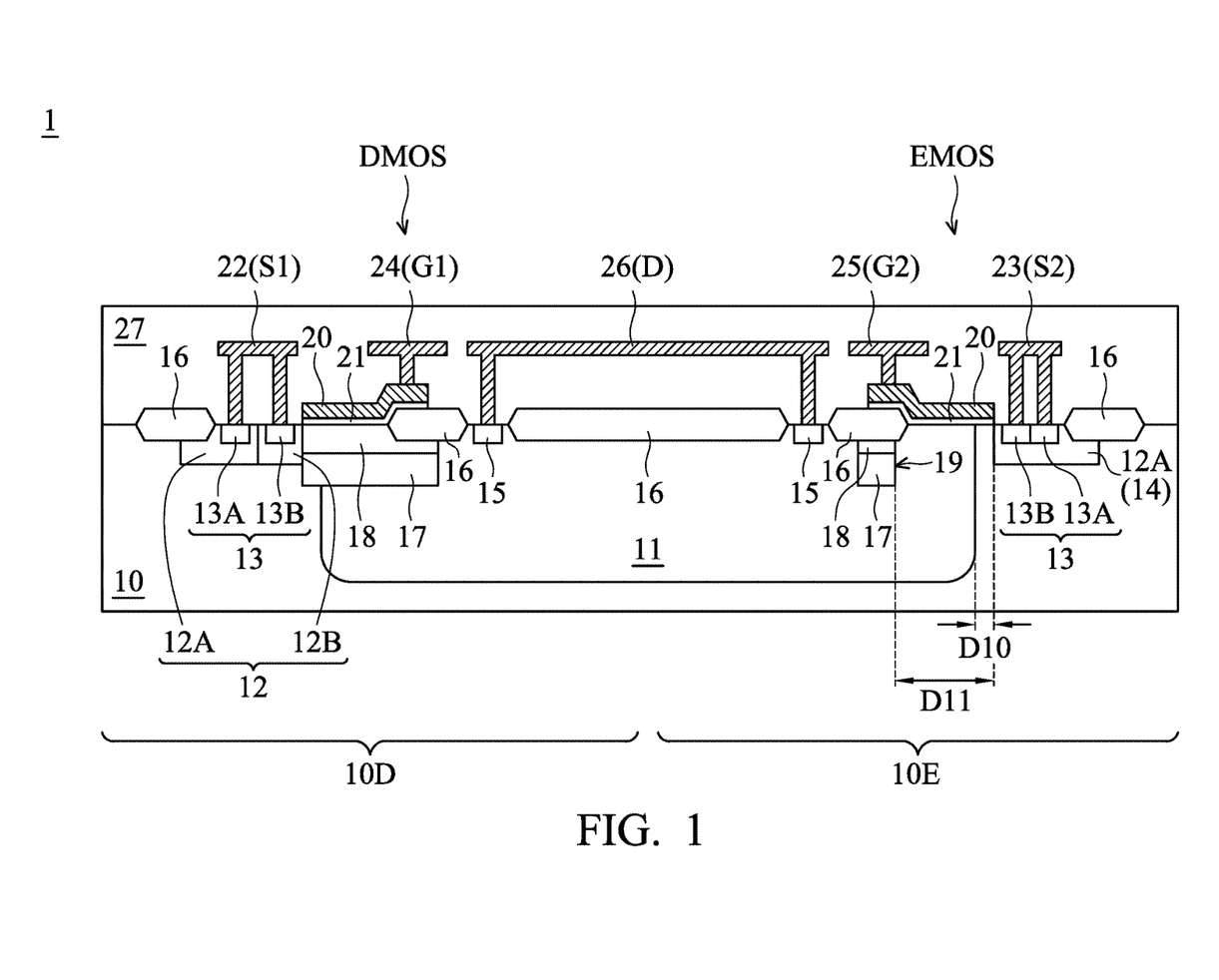
FIG. 1 is a cross-sectional view of a power semiconductor device according to one exemplary embodiment.

FIG. 1 is a cross-sectional view of a power semiconductor device according to one exemplary embodiment. In the embodiment of FIG. 1, the power semiconductor device 1 is implemented by a semiconductor device whose conductive type is N-type. Referring to FIG. 1, the power semiconductor device 1 comprises a semiconductor substrate 10 whose conductive type is P-type. The semiconductor substrate 10 is divided to a region 10D and a region 10E. An N-type well region 11 is disposed in the regions 10D and 10E of the semiconductor substrate 10. A $P^+$-type doped region 12A is disposed in the regions 10D and 10E of the semiconductor substrate 10, and an N+-type doped region 12B is disposed in the region 10D of the semiconductor substrate 10. In the region 10D, the P+-type doped region 12A and the N+-type doped region 12B form a body region 12, and the N+-type doped region 12B is disposed between the well region 11 and the P+-type doped region 12A. In the region 10E, the P+-type doped region 12A serves as a body region 14. Referring to FIG. 1, the well region 11 is disposed between the body regions 12 and 14. A P-type contact region 13A is disposed in the P+-type doped region 12A of the body regions 12 and 14. An N-type contact region 13B is disposed in the N+-type doped region 12B of the body region 12 and further in the P+-type doped region 12A of the body region 14. As shown in FIG. 1, the contact region 13B is disposed between the well region 11 and the P+-type doped region 12A. The contact regions 13A and 13B are disposed to form a source region 13. In details, in the region 10D, the contact region 13A and the adjacent contact region 13B forms one portion (first portion) of the source region 13; in the region 10E, the contact region 13A and the adjacent contact region 13B forms another portion (second portion) of the source region 13. In other words, one portion of the source region 13 is disposed in the body region 12, and another portion of the source region 13 is disposed in the body region 14. An N-type contact region 15 is disposed on the well region 11 and further in the regions 10D and 10E to serve as a source region. A field insulating layer 16 is disposed on the semiconductor substrate 10. There is a portion of the field insulating layer 16 between the contact region 15 of the region 10D and the contact region 15 of the region 10E.

Referring to FIG. 1, a P+-type doped region 17 is disposed in the well region 11, and an N+-type doped region 18 is disposed above the P+-type doped region 17. Each of the P+-type doped region 17 and the N+-type doped region 18 may be divided into a portion (first portion) disposed in the region 10D and another portion (second portion) disposed in the region 10E. In the region 10D, the P+-type doped region 17 and the N+-type doped region 18 extend toward the body region 12 and out of the well region 11 and contact the body region 12. In the region 10E, the P+-type doped region 17 and the N+-type doped region 18 are totally disposed in the well region 11. Referring to FIG. 1, the P+-type doped region 17 and the N+-type doped region 18 in the region 10E is aligned with the doped-region boundary 19, and the doped-region boundary 19 is in the well region 11. In details, there is a space distance D11 between the doped-region boundary 19 and the boundary of the body region 14 which is close to the well region 11, and the space distance D11 is larger than the distance D10 between the body region 14 and the well region 11.

Moreover, a gate insulating layer 21 is disposed in the regions 10D and 10E of the semiconductor substrate 10 and covers one portion of the field insulating layer 16. In the region 10D, the gate insulating layer 21 extends in the direction from the field insulating layer 16 to the body region 12 to cover the N+-type doped region 18. In the region 10E, the gate insulating layer 21 extends in the direction from the field insulating layer 16 to the body region 14 to cover one portion of the well region 11 and one portion of the semiconductor substrate 10. A gate structure 20 is disposed on the gate dielectric layer. According to the disposition relationship between the field insulating layer 16, the gate insulating layer 21, and the N+-type doped region 18, one portion of the N+-type doped region 18 in the region 10D is covered by one portion of the gate insulating layer 21, while the N+-type doped region 18 in the region 10E is not covered by the gate insulating layer 21. Referring to FIG. 1, due to the disposition of the source region 13, the drain region 15, the gate structure 20, and the doped regions 17 and 18, the source region 13, the drain region 15, and the gate structure 20 in the region 10D form a depletion transistor DMOS, while source region 13, the drain region 15, and the gate structure 20 in the region 10E form an enhancement transistor EMOS.

Figure 2:
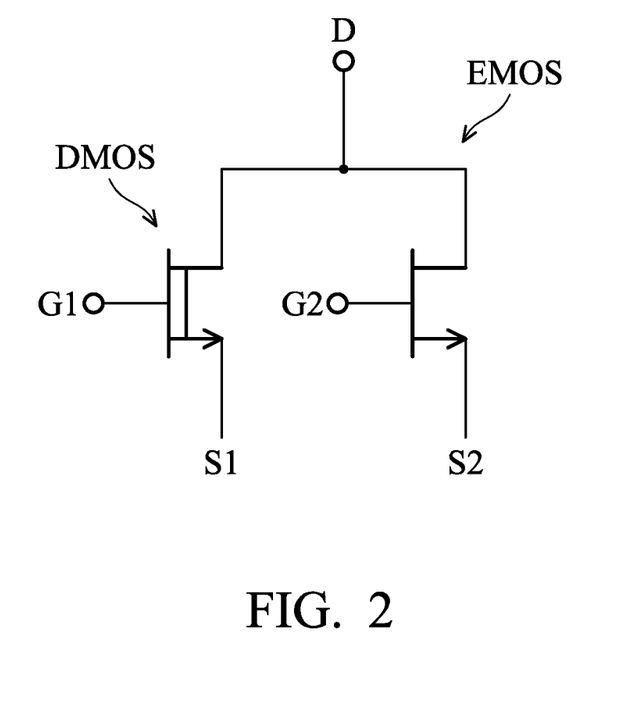
FIG. 2 is a schematic view showing an equivalent circuit of the power semiconductor device of FIG. 1.

FIG. 2 shows an equivalent circuit of the power semiconductor device 1 of FIG. 1. Referring to FIGS. 1 and 2, a source inter-connection line 22 is electrically connected to the contact regions 13A and 13B in the region 10D to form the source electrode S1 of the depletion transistor DMOS, and a source inter-connection line 23 is electrically connected to the contact regions 13A and 13B in the region 10E to form the source electrode S2 of the enhancement transistor EMOS. A gate inter-connection line 24 is electrically connected to the gate structure 20 in the region 10D to form the gate electrode G1 of the depletion transistor DMOS, and a gate inter-connection line 25 is electrically connected to the gate structure 20 in the region 10E to form the gate electrode G2 of the enhancement transistor EMOS. A drain inter-connection line 26 is electrically connected to the contact region 15 in the regions 10D and 10E to form the drain electrodes D of the depletion transistor DMOS and the enhancement transistor EMOS. In other words, the drain electrode of the depletion transistor DMOS and the drain electrode of the enhancement transistor EMOS are connected to each other. Moreover, an inter-dielectric layer 27 is disposed to cover these electrodes 22-26. According to the embodiment of FIG. 1, the power semiconductor device 1 comprises both of the depletion transistor DMOS and the enhancement transistor EMOS. Moreover, after the power semiconductor device 1 is packaged, only one line is needed to connect the drain electrodes of the depletion transistor DMOS and the enhancement transistor EMOS.

Figure 3A:
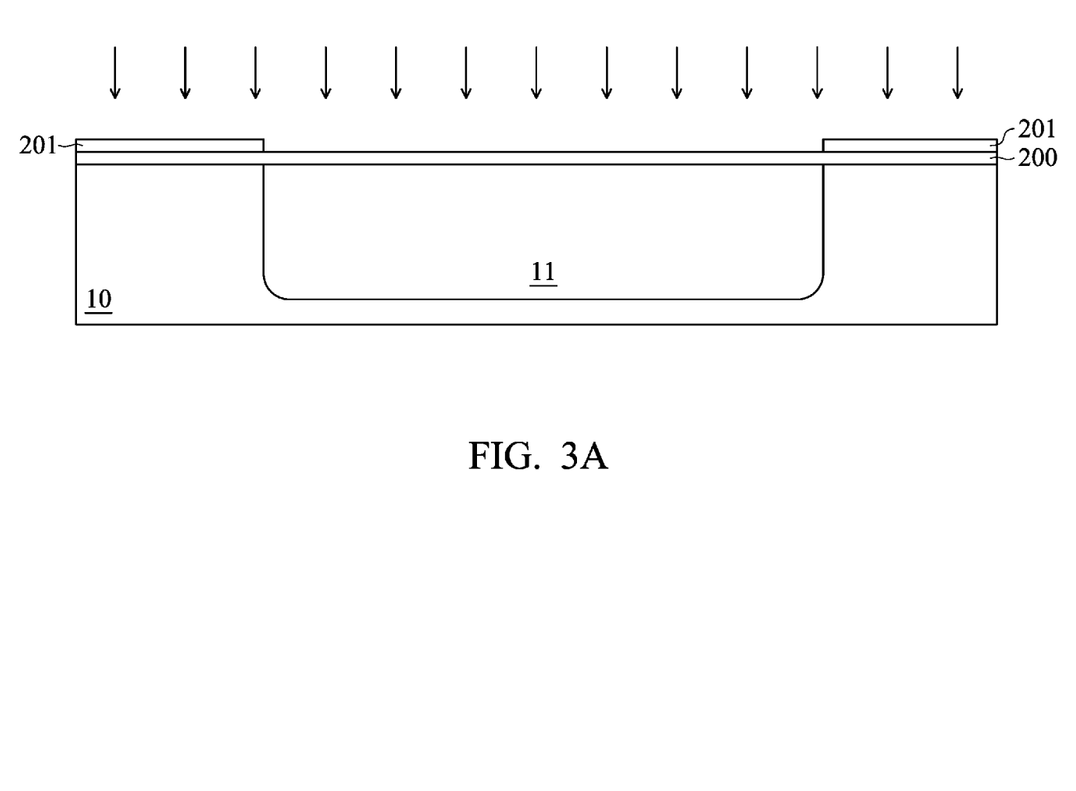
FIGS. 3A-3F show a method of manufacturing a power semiconductor device according to an exemplary embodiment.

The manufacturing method for the power semiconductor device 1 will be described in the following by referring to the corresponding drawings. Referring to FIG. 3A, a P-type semiconductor substrate 10 with a sacrificial layer 200 is formed. The semiconductor substrate 10 can be a silicon substrate, a silicon-on-insulator (SOI) substrate, a SiGe substrate, or any other appropriate semiconductor substrate. The sacrificial layer 200 may be an oxide, nitride, or oxynitride film layer. An implantation protection layer 201 is formed on the sacrificial layer 200. The implantation protection layer 201 is patterned, and then a region is exposed for implantation. Then, an N-type dopant is implanted into the semiconductor substrate 10 to form a well region 11. The dopant concentration of the N-type dopant for the well region 11 can be higher than the dopant concentration of the semiconductor substrate 10, such as $1 \times 10^{14} \sim 1 \times 10^{15}$ atom/cm². After the well region 11 is formed, the implantation protection layer 201 is removed from the sacrificial layer 200.

Figure 3B:
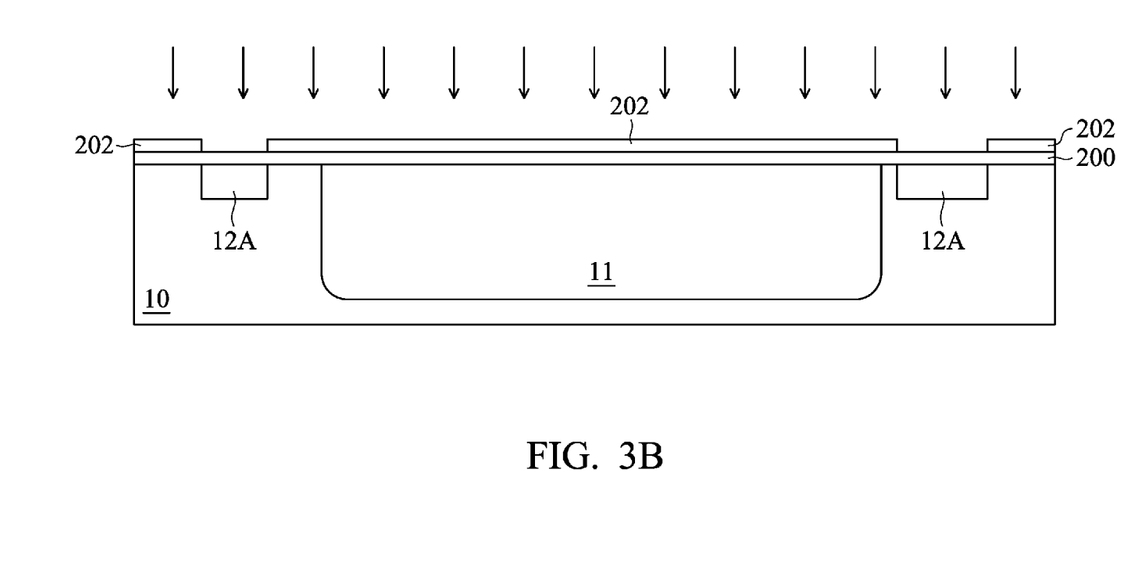
Figure 3C:
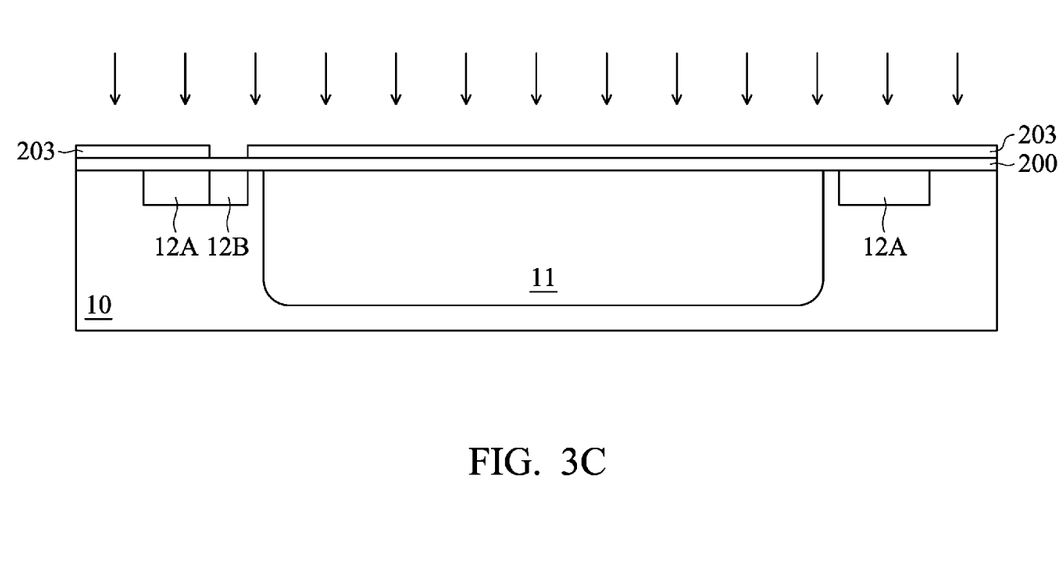

Then, the exemplary steps for forming body regions 12 and 14 will be described by referring to FIGS. 3B and 3C. Referring to FIG. 3B, another implantation protection layer 202 is formed on the sacrificial layer 200. The implantation protection layer 202 is patterned, and a region is exposed for implantation. Then, a P-type dopant is implanted into the semiconductor substrate 10 to form a P+-type doped region 12A. The dopant concentration of the P-type dopant for the P+-type doped region 12A can be set as, for example, $1 \times 10^{16} \sim 9 \times 10^{16}$ atom/cm². After the P+-type doped region 12A is formed, the implantation protection layer 202 is removed from the sacrificial layer 200. Referring to FIG. 3C, another implantation protection layer 203 is formed on the sacrificial layer 200. The implantation protection layer 203 is patterned to expose, and then a region is exposed for implantation. Then, an N-type dopant is implanted into the semiconductor substrate 10 to form an N$^+$-type doped region 12B. The dopant concentration of the N-type dopant for the N$^+$-type doped region 12B can be set as, for example, $1\times10^{16}$~$9\times10^{16}$ atom/cm$^2$. After the N$^+$-type doped region 12B is formed, the implantation protection layer 203 is removed from the sacrificial layer 200. Referring to FIGS. 1 and 3C, the P$^+$-type doped region 12A and N$^+$-type doped region 12B on the right side of FIG. 3C form the body region 12 in the region 12D. the P$^+$-type doped region 12A on the left side of FIG. 3C form the body region 14 in the region 12E.

Figure 3D:
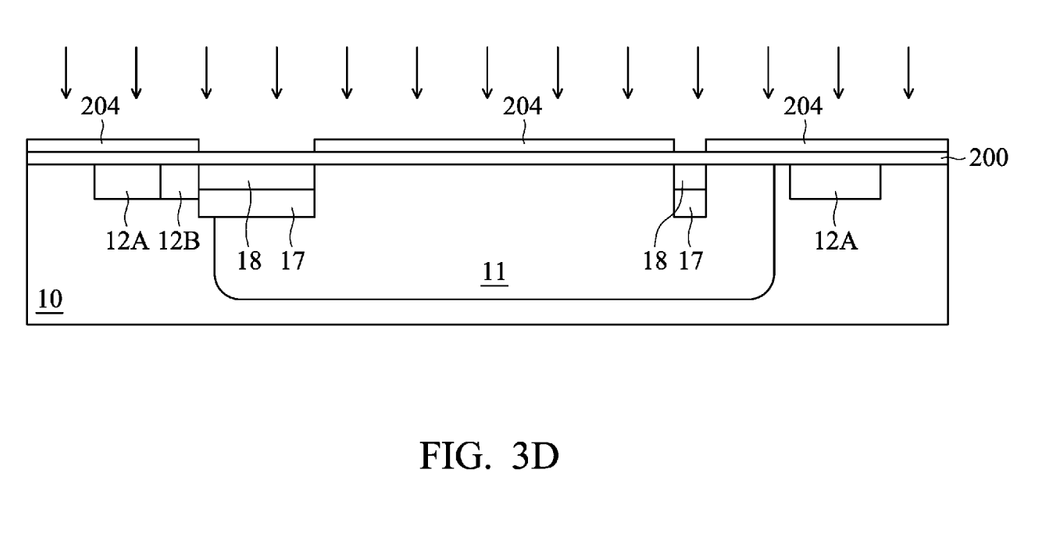

The exemplary steps for forming a P$^+$-type region 17 and an N$^+$-type region 18 will be described by referring to FIG. 3D. In the embodiment, the P$^+$-type region 17 and the N$^+$-type region 18 are formed in the semiconductor substrate 10 by performing an implantation process. The P$^+$-type region 17 and the N$^+$-type region 18 are stacked from bottom to top in the vertical direction. Referring to FIG. 3D, another implantation protection layer 204 is formed on the sacrificial layer 200. The implantation protection layer 204 is patterned, and then a region is exposed for implantation. Then, a P-type dopant and an N-type dopant are implanted into the semiconductor substrate 10 to form a P$^+$-type doped region 17 and an N$^+$-type doped region 18 respectively. For example, the P-type implantation can be performed earlier than the N-type implantation, so that the P$^+$-type doped region 17 is formed earlier the N$^+$-type doped region 18, however, this formation is not a limitation for the invention. The dopant concentration of the P-type dopant for the P$^+$-type doped region 17 and/or the dopant concentration of the N-type dopant for the N$^+$-type doped region 18 can be set as, for example, $1\times10^{15}$~$5\times10^{15}$ atom/cm$^2$, so that the dopant concentration of the P$^+$-type doped region 17 and/or the dopant concentration of the N$^+$-type doped region 18 is higher than the dopant concentration of the semiconductor substrate 10. In other embodiments, the dopant concentration of the P-type dopant for the P$^+$-type doped region 17 is set to be higher than the dopant concentration of the semiconductor substrate 10, while the dopant concentration of the N-type dopant for he N$^+$-type doped region 18 is set to be lower than the dopant concentration of the semiconductor substrate 10. As shown in FIGS. 1 and 3D, one portion of the P$^+$-type doped region 17 and one portion of the N$^+$-type doped region 18 (that is, the P$^+$-type doped region 17 and the N$^+$-type doped region 18 in the region 10D) are formed in the well region 11 and further extend toward the body region 12 and out of the well region 11 and then contact the body region 12. One portion of the P$^+$-type doped region 17 and one portion of the N$^+$-type doped region 18 (that is, the P$^+$-type doped region 17 and the N$^+$-type doped region 18 in the region 10E) are totally disposed in the well region 11. After the P$^+$-type doped region 17 and the N$^+$-type doped region 18 are formed, the implantation protection layer 204 is removed from the sacrificial layer 200.

Figure 3E:
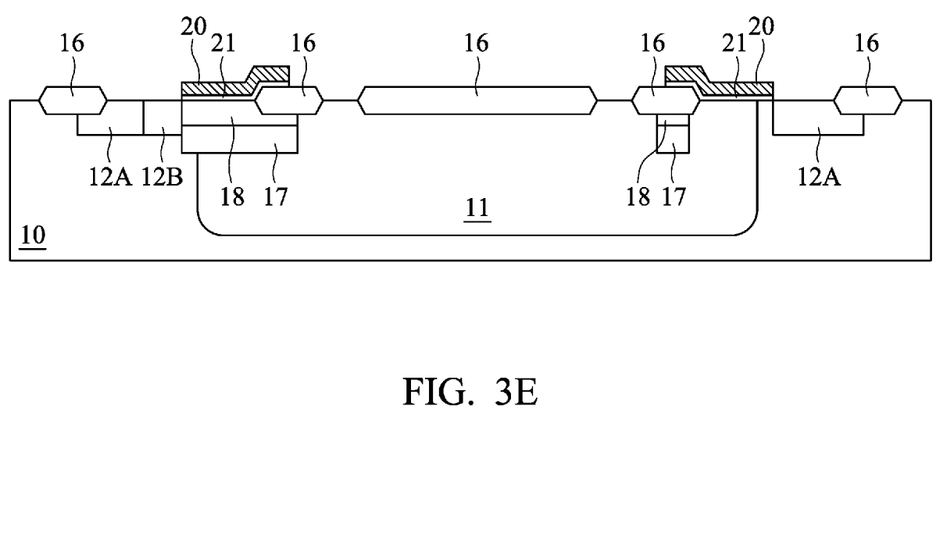

Then, referring to FIG. 3E, after the well region 11, the doped regions 12A and 12B, and the doped regions 17 and 18 are formed in the semiconductor substrate 10 as shown in FIGS. 3A-3D, a field insulating layer 16 is formed on the semiconductor substrate 10. The material of the field insulating layer 16 may include oxide, nitride, or nitrogen oxide. The field insulating layer 16 may be formed by oxidizing and/or nitriding the semiconductor substrate 10 or by depositing oxide, nitride, or nitrogen oxide on the semiconductor substrate 10. As shown in FIG. 3E, the field insulating layer 16 is formed on the semiconductor substrate 10. The field insulating layer 16 is patterned, and then the well region 11, the surfaces of the P$^+$-type doped region 12A, the N$^+$-type doped region, 12B, and N$^+$-type region 18 are exposed Continuously referring to FIG. 3E, a gate insulating layer 21 is disposed in the regions 10D and 10E of the semiconductor substrate 10 and covers one portion of the field insulating layer 16. The material of the gate insulating layer 21 may include oxide, nitride, or nitrogen oxide. Referring to FIG. 3E, during the process for forming the gate insulating layer 21, the gate insulating layer 21 in the region 10D extends in the direction from the field insulating layer 16 to the body region 12 to cover the N$^+$-type doped region 18, while the gate insulating layer 21 in the region 10E extends in the direction from the field insulating layer 16 to the body region 14 to cover one portion of the well region 11 and one portion of the semiconductor substrate 10. Moreover, a gate structure 20 is disposed on the gate dielectric layer. The material of the gate structure 20 may include poly-silicon, one or more metal, silicide, or other conductive material. According to the disposition relationship between the field insulating layer 16, the gate insulating layer 21, and the N$^+$-type doped region 18, one portion of the N$^+$-type doped region 18 in the region 10D is covered by the gate dielectric layer 21, while the N$^+$-type doped region 18 in the region 10E is not covered by the gate insulating layer 21.

Figure 3F:
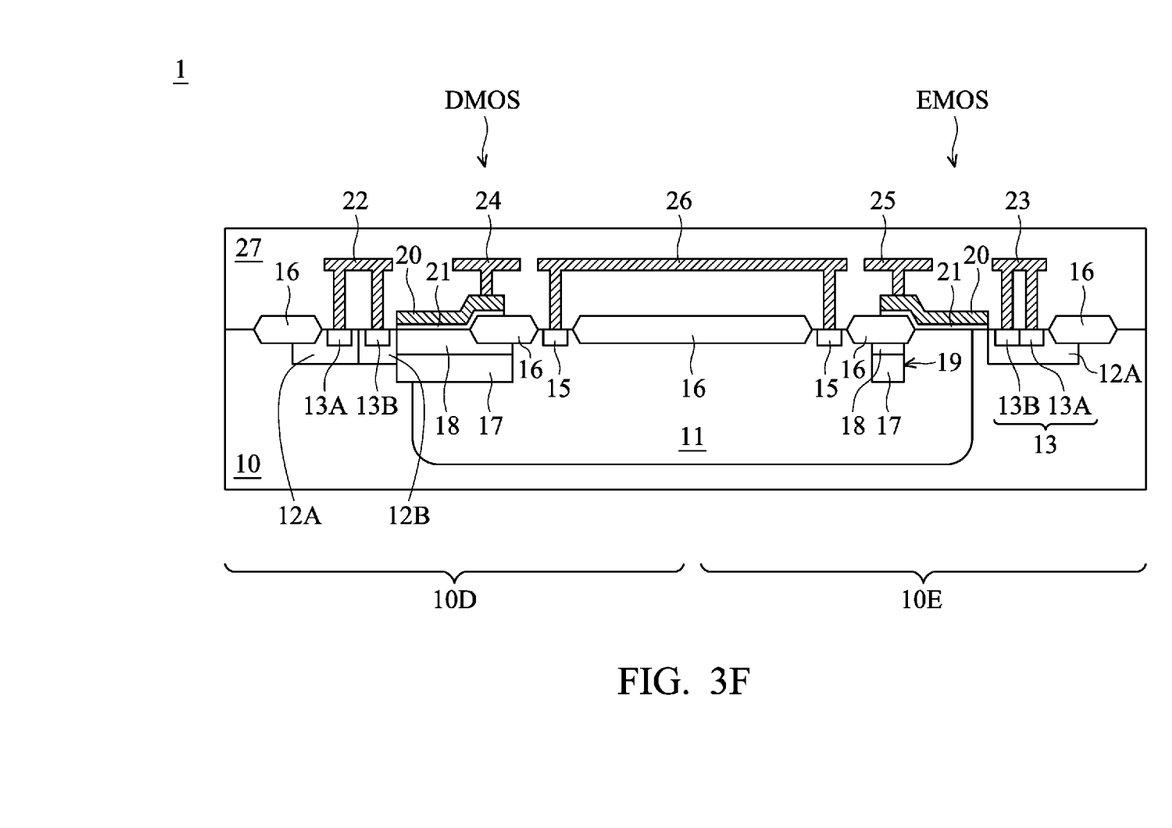

Referring to FIGS. 1 and 3F, a P-type contact region 13A is disposed in the P$^+$-type doped region 12A of the body regions 12 and 14, and P-type contact region 13A is disposed in the P$^+$-type doped region 12A of the body regions 12 and 14, and an N-type contact region 13B is disposed in the N$^+$-type doped region 12B of the body region 12 and further in the P$^+$-type doped region 12A of the body region 14. In the region 10D, the contact region 13A and the adjacent contact region 13B forms one portion of the source region 13; in the region 10E, the contact region 13A and the adjacent contact region 13B forms another portion of the source region 13. The contact regions 13A and 13B are formed by implanting a corresponding P-type dopant and an N-type dopant into the body regions 12 and 14. Moreover, an N-type contact region 15 is formed in the well region 11 to serve as a drain region. The contact region 15 is formed by implanting an N-type dopant into the well region 11. The dopant concentrations of the above source region and the drain region are set as $5\times10^{19}$ atom/cm$^2$ or $1\times10^{19}$~$9\times10^{19}$ atom/cm$^2$. In some embodiments, the dopant concentrations of the above source region and the drain region may be set to different values. Then, referring to FIGS. 1-2 and 3F, a source inter-connection line 22 is electrically connected to the contact regions 13A and 13B in the region 10D to form the source electrode S1 of the depletion transistor DMOS, and a source inter-connection line 23 is electrically connected to the contact regions 13A and 13B in the region 10E to form the source electrode S2 of the enhancement transistor EMOS. Moreover, a gate inter-connection line 24 is formed and electrically connected to the gate structure 20 in the region 10D to form the gate electrode G1 of the depletion transistor DMOS, and a gate inter-connection line 25 is formed and electrically connected to the gate structure 20 in the region 10E to form the gate electrode G2 of the enhancement transistor EMOS. In the exemplary step in FIG. 3F, a drain inter-connection line 26 is further formed and electrically connected to the contact region 15 in the regions 10D and 10E to form the drain electrodes D of the depletion transistor DMOS and the enhancement transistor EMOS. These inter-connection lines 22-26 can be formed sequentially or simultaneously. Moreover, the material of the inter-connection lines 22-26 may include poly-silicon, one or more metal, silicide, or other conductive material. In some embodiments, the material of the inter-connection lines 22-26 is the same as the material of the gate structure 3. After the inter-connection lines 22-26 are formed, an inter-dielectric layer 27 is deposited on the semiconductor substrate 10 to cover the above inter-connection lines 22-26.

Figure 4:
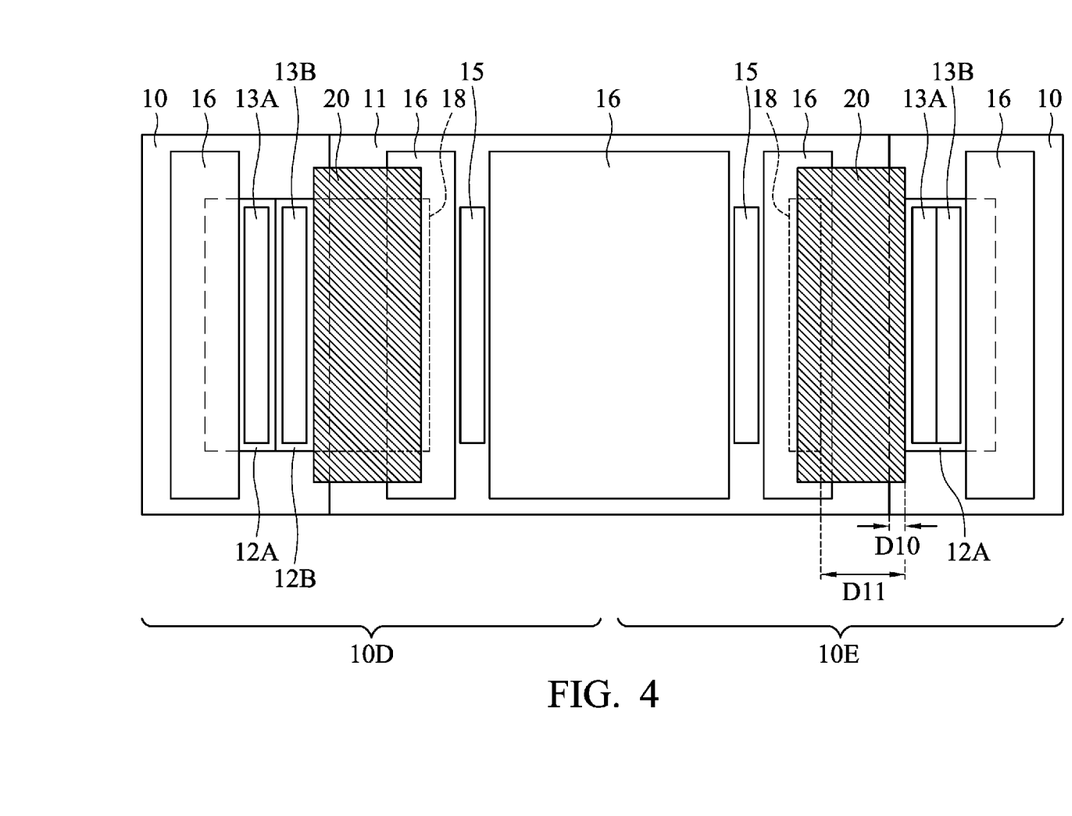
FIG. 4 is a top view of the power semiconductor device of FIG. 1.

FIG. 4 is a top view of the power semiconductor device 1. In order to clearly show the contact regions 13A and 13B, the contact region 15, and the N$^+$-type doped region 18, FIG. 4 does not show the gate structure 20 and the inter-connection lines 22-26. Referring to FIG. 4, there is a space distance D11 between the N$^+$-type doped region 18 in the region 10E and the body region 14, and the space distance D11 is larger than the distance D10 between the body region 14 and the well region 11.

Figure 5:
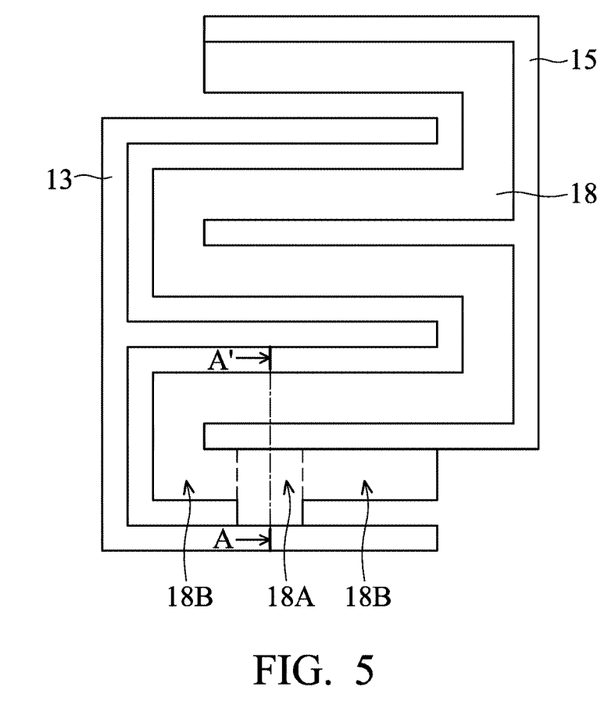
FIG. 5 is a schematic view showing a structure shape of the power semiconductor device of FIG. 1.

In an embodiment, the power semiconductor device 1 has a finger-type structure. As shown in FIG. 5, the source region 13 and the drain region 15 are formed by finger shapes respectively. The finger extended portions of the source region 13 and the finger extended portions of the drain region 15 are disposed alternately. The cross-sectional view of the power semiconductor device 1 shown in FIG. 1 is obtained in response to the cross-sectional line A'-A in FIG. 5. In order to clearly show the position relationship between the source region 13, the drain region 15, and the N$^+$-type doped region 18, the other elements are not shown in FIG. 5. Referring to FIGS. 1 and 5, the N$^+$-type doped region 18 is divided into a first portion 18A and a second portion 18B. The first portion 18A indicates the N$^+$-type doped region 18 in the region 10D. The area of the second portion 18A is equal to 1%~99% of the total area of the N$^+$-type doped region 18. In other embodiments, the power semiconductor device 1 may have a circular structure, a track-type structure, or a rectangular structure.

Figure 6:
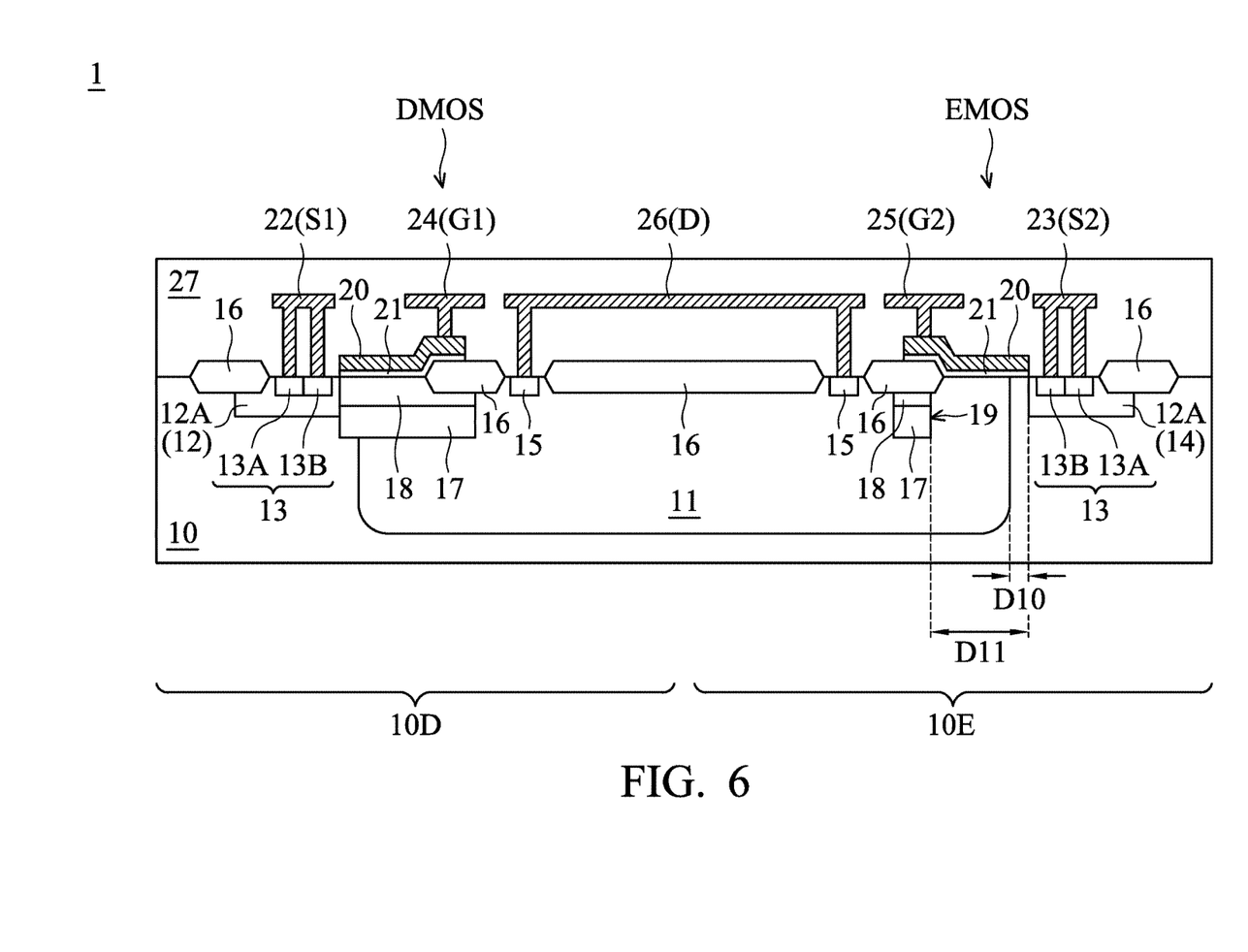
FIG. 6 is a cross-sectional view of a power semiconductor device according to another exemplary embodiment.

In the above embodiments, the body region 12 in the region 10D is formed by the P$^+$-type doped region 12A and the N$^+$-type doped region 12B, and the contact regions 13A and 13B are disposed in the doped regions 12A and 12B respectively. In other embodiments, as shown in FIG. 6, like the body region 14 in the region 10E, the body region 12 is formed only by the P$^+$-type doped region 12A, and both of the contact regions 13A and 13B are disposed in the P$^+$-type doped region 12A. In the process for manufacturing the power semiconductor device of FIG. 6, the step of forming the N$^+$-type doped region 12B in FIG. 3D is omitted.

In the above embodiments, the power semiconductor devices are implemented by N-type devices. However, in other embodiments, the power semiconductor devices can be implemented by P-type devices. The structures of the P-type power semiconductor devices are similar to the structures of the above N-type power semiconductor devices, but the conductive types of the material of the P-type power semiconductor devices is opposite to the conductive types of the material of the N-type power semiconductor devices.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor device, comprising:
    a substrate having a first conductive type and comprising a first region and a second region;
    a first body region disposed in the first region of the substrate;
    a second body region, disposed in the second region of the substrate, having the first conductive type;
    a well region, disposed in the first region and the second region of the substrate and between the first body region and the second body region, having a second conductive type opposite to the first conductive type;
    a source region comprising a first portion disposed in the first body region and a second portion disposed in the second body region;
    a drain region disposed on the well region;
    a first doped region, disposed in the well region, having the first conductive type; and
    a second doped region, disposed in the well region and stacked on the first doped region, having the second conductive type,
    wherein a first portion of the first doped region and a first portion of the second doped region are disposed in the well region of the first region of the substrate and extend toward the first body region and out of the well region.

2. The semiconductor device as claimed in claim 1, wherein the first portion of the first doped region and the first portion of the second doped region extend out of the well region and contact the first body region.

3. The semiconductor device as claimed in claim 2, wherein a second portion of the first doped region and a second portion of the second doped region are disposed in the second region of the substrate and aligned with a doped-region boundary, and there is a space distance between the doped-region boundary and the second body region.

4. The semiconductor device as claimed in claim 1, wherein a second portion of the first doped region and a second portion of the second doped region are disposed in the second region of the substrate and totally disposed in the well region.

5. The semiconductor device as claimed in claim 4, wherein the second portion of the first doped region and the second portion of the second doped region are aligned with a doped-region boundary, and the doped-region boundary is in the well region.

6. The semiconductor device as claimed in claim 1, further comprising:
    a gate structure disposed on the first doped region,
    wherein the first portion of the source region, the drain region in the first region of the substrate, and the gate structure disposed on the first portion of the first doped region form a depletion transistor.

7. The semiconductor device as claimed in claim 6, wherein a second portion of the first doped region is disposed in the second region of the substrate, and the second portion of the source region, the drain region in the second region of the substrate, and the gate structure formed on the second portion of the first doped region form an enhancement transistor.

8. The semiconductor device as claimed in claim 1, further comprising:
an insulating layer disposed on the well region;
a gate insulating layer covering a portion of the insulating layer and extending toward the first body region to cover the first portion of the second doped region; and
a gate structure disposed on the gate insulating layer.

9. The semiconductor device as claimed in claim 8, wherein a second portion of the second doped region is disposed in the second region of the substrate, and the gate insulating layer extends toward the second body region to cover a portion of the well region.

10. The semiconductor device as claimed in claim 1, wherein source region comprises:
a first contact region having the second conductive type; and
a second contact region having the first conductive type,
wherein the first contact region is disposed between the well region and the second contact region.

11. The semiconductor device as claimed in claim 10, wherein the first body region comprises:
a third doped region, disposed in the first region of the substrate, having the second conductive type; and
a fourth doped region, disposed in the first region and the second region of the substrate, having the first conductive type,
wherein the first contact region of the first portion of the source region is disposed in the third doped region, and the second contact region of the first portion of the source region is disposed in the fourth doped region.

12. The semiconductor device as claimed in claim 11, wherein the first contact region and the second contact region of the second portion of the source region are disposed in the fourth doped region.

13. The semiconductor device as claimed in claim 1, wherein the first conductive type is P type, and the second conductive type is N type.

14. The semiconductor device as claimed in claim 1, wherein the first conductive type is N type, and the second conductive type is P type.

15. The semiconductor device as claimed in claim 1, wherein the drain region comprises:
a contact region, disposed in the first region and the second region of the substrate, having the second conductive type, and
wherein the semiconductor device further comprises:
an inter-connection line connected to the contact region in the first region of the substrate and the contact region in the second region of the substrate.

16. A method for manufacturing a semiconductor device, comprising:
forming a substrate having a first conductive type, wherein the substrate comprises a first region and a second region;
forming a first body region in the first region of the substrate;
forming a second body region in the second region of the substrate, wherein the second body region has the first conductive type;
forming a well region in the first region and the second region of the substrate, wherein the well region is formed between the first body region and the second body region and has a second conductive type opposite to the first conductive type;
forming a source region, wherein a first portion of the source region is formed in the first body region, and a second portion of the source region is formed in the second body region;
forming a drain region disposed on the well region;
implanting a first dopant in the well region to form a first doped region, wherein the first doped region has the first conductive type; and
implanting a second dopant in the well region and on the first doped region to form a second doped region, wherein the second doped region has the second conductive type,
wherein a first portion of the first doped region and a first portion of the second doped region are formed in the well region of the first region of the substrate and extend toward the first body region and out of the well region.

17. The method as claimed in claim 16, wherein the first portion of the first doped region and the first portion of the second doped region extend out of the well region and contact the first body region.

18. The method as claimed in claim 17, wherein a second portion of the first doped region and a second portion of the second doped region are disposed in the second region of the substrate and aligned with a doped-region boundary, and there is a space distance between the doped-region boundary and the second body region.

19. The method as claimed in claim 16, wherein a second portion of the first doped region and a second portion of the second doped region are disposed in the second region of the substrate and totally disposed in the well region.

20. The method as claimed in claim 19, wherein the second portion of the first doped region and the second portion of the second doped region are aligned with a doped-region boundary, and the doped-region boundary is in the well region.

21. The method as claimed in claim 16, further comprising:
forming a gate structure in the first doped region,
wherein the first portion of the source region, the drain region in the first region of the substrate, and the gate structure formed on the first portion of the first doped region form a depletion transistor.

22. The method as claimed in claim 21, wherein a second portion of the first doped region is formed in the second region of the substrate, and the second portion of the source region, the drain region in the second region of the substrate, and the gate structure formed on the second portion of the first doped region form an enhancement transistor.

23. The method as claimed in claim 16, further comprising:
forming an insulating layer on the well region;
forming a gate insulating layer to cover a portion of the insulating layer, wherein the gate insulating layer extends toward the first body region to cover the first portion of the second doped region; and
forming a gate structure on the gate insulating layer.

24. The method as claimed in claim 23, wherein the gate insulating layer extends toward the second body region to cover a portion of the well region.

25. The method as claimed in claim 16, wherein forming the source region comprises:
implanting the second dopant to form a first contact region, wherein the first contact region has the second conductive type; and implanting the first dopant to form a second contact region, wherein the first contact region has the first conductive type, wherein the first contact region is disposed between the well region and the second contact region.

26. The method as claimed in claim 25, wherein forming the first body region comprises:

implanting the second dopant in the first region of the substrate to form a third doped region wherein the third doped region has the second conductive type; and implanting the first dopant in the first region and the second region of the substrate to form a fourth doped region, wherein the fourth doped region has the first conductive type, wherein the first contact region of the first portion of the source region is formed in the third doped region, and the second contact region of the first portion of the source region is formed in the fourth doped region.

27. The method as claimed in claim 26, wherein the first contact region and the second contact region of the second portion of the source region are formed in the fourth doped region.

28. The method as claimed in claim 16, wherein the first conductive type is P type, and the second conductive type is N type.

29. The method as claimed in claim 16, wherein the first conductive type is N type, and the second conductive type is P type.

30. The method as claimed in claim 16, wherein forming the drain region comprises:

forming a contact region in the first region and the second region of the substrate, wherein the contact region has the second conductive type, and wherein the method further comprises:

connecting the contact region in the first region of the substrate with the contact region in the second region of the substrate through an inter-connection line.

* * * * *